US009899562B2

(12) United States Patent
Yang

(10) Patent No.: US 9,899,562 B2
(45) Date of Patent: Feb. 20, 2018

(54) METHOD OF FABRICATING A SOLAR CELL

(71) Applicant: AU Optronics Corporation, Hsin-chu (TW)

(72) Inventor: Po-Chuan Yang, Hsin-chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 82 days.

(21) Appl. No.: 15/135,048

(22) Filed: Apr. 21, 2016

(65) Prior Publication Data
US 2016/0240725 A1 Aug. 18, 2016

Related U.S. Application Data

(62) Division of application No. 14/314,443, filed on Jun. 25, 2014, now abandoned.

(30) Foreign Application Priority Data

Jun. 27, 2013 (CN) .......................... 2013 1 0261659

(51) Int. Cl.
H01L 31/00 (2006.01)
H01L 31/20 (2006.01)
H01L 31/0216 (2014.01)
H01L 31/0224 (2006.01)
H01L 31/18 (2006.01)

(52) U.S. Cl.
CPC ...... *H01L 31/202* (2013.01); *H01L 31/02168* (2013.01); *H01L 31/022425* (2013.01); *H01L 31/1884* (2013.01); *Y02E 10/50* (2013.01)

(58) Field of Classification Search
None
See application file for complete search history.

(56) References Cited

U.S. PATENT DOCUMENTS

| 2009/0107547 | A1 | 4/2009 | Nakashima et al. |
| 2010/0000597 | A1 | 1/2010 | Cousins |
| 2010/0012179 | A1 | 1/2010 | Cheng |
| 2011/0139243 | A1 | 6/2011 | Shim et al. |
| 2011/0168243 | A1* | 7/2011 | Elowe ............... H01L 31/02167 136/255 |
| 2011/0265866 | A1 | 11/2011 | Oh et al. |
| 2012/0048362 | A1 | 3/2012 | Lee et al. |

FOREIGN PATENT DOCUMENTS

| CN | 103107212 | 5/2013 |
| JP | 1-268149 | 10/1989 |
| JP | 11-3882 | 1/1999 |
| TW | 201128242 | 8/2011 |
| TW | I371864 | 9/2012 |

* cited by examiner

*Primary Examiner* — Eli Mekhlin
(74) *Attorney, Agent, or Firm* — WPAT, PC

(57) ABSTRACT

A method for fabricating a solar cell includes the steps of providing a substrate, forming a transparent conductive layer on a surface of the substrate, forming a plurality of photoresist patterns on the transparent conductive layer, forming a dielectric layer on the photoresist patterns and the transparent conductive layer, in which a part of a sidewall of the photoresist pattern is exposed from the dielectric layer, removing the photoresist patterns and a part of the dielectric layer covering the photoresist pattern so that a plurality of openings are defined in the remaining part of the dielectric layer, and forming plural electrodes in the openings respectively. A solar cell fabricated by the method is also disclosed.

6 Claims, 8 Drawing Sheets

METHOD OF FABRICATING A SOLAR CELL

RELATED APPLICATIONS

This application is a Divisional Application of U.S. application Ser. No. 14/314,443, filed on Jun. 25, 2014, now abandoned, and claims priority to Chinese Application Serial Number 201310261659.8, filed Jun. 27, 2013 which is herein incorporated by reference.

BACKGROUND

Field of Invention

The present invention relates to a method of fabricating a solar cell.

Description of Related Art

Crude oil reserves have been on the decline recent years, and as a result, the energy shortage problem has become a focal point around the world. To deal with the energy depletion crisis, it is important to make investment in research and development of substitutional energy resources. With the increased awareness of environmental protection issues, solar energy is in the spotlight among related technologies because of its advantages of being clean and inexhaustible. Thus, it is common to install solar panels at locations where the sunlight is abundant, such as on building rooftops, public squares, etc.

With the development of the solar cell industry, how to increase electrical generation efficiency of solar cells and lower manufacturing costs have become important issues in the industry.

SUMMARY

The present invention provides a fabricating method for a solar cell to lower manufacturing costs of the solar cell and reduce the amount of photoresist consumption.

In addition, the present invention provides a solar cell to increase the efficiency of electrical generation through the effective control of the linewidth of electrodes.

The fabricating method for solar cells includes the steps of providing a substrate; forming a transparent conductive layer on a surface of the substrate; forming a plurality of photoresist patterns on the transparent conductive layer; forming a dielectric layer on the photoresist patterns and the transparent conductive layer, in which a part of a sidewall of the photoresist patterns is exposed from the dielectric layer; removing the photoresist patterns and a part of the dielectric layers covering the photoresist patterns, thereby forming a plurality of openings in the remaining part of the dielectric layer; and forming a plurality of electrodes in the openings respectively.

According to one or more embodiments of the present invention, the fabricating method for solar cells further includes the step of forming a seed conductive layer on the transparent conductive layer before the photoresist patterns are formed on the transparent conductive layer, in which the electrodes are formed on the seed conductive layer.

According to one or more embodiments of the present invention, sidewalls of the electrodes are substantially perpendicular to the transparent conductive layer.

According to one or more embodiments of the present invention, the fabricating method for solar cells further includes the step of removing the dielectric layer after the electrodes are formed.

According to one or more embodiments of the present invention, the electrodes are formed in the openings by an electroplating process in the step of forming the electrode.

According to one or more embodiments of the present invention, the substrate includes an N-type single crystal silicon layer, a first heterogeneous interlayer and a second heterogeneous interlayer formed on two opposite surfaces of the N-type single crystal silicon layer, a P-type amorphous silicon layer formed on the first heterogeneous interlayer, and an N-type amorphous silicon layer formed on the second heterogeneous interlayer.

According to one or more embodiments of the present invention, a transparent conductive layer is formed on the P-type amorphous silicon layer and/or the N-type amorphous silicon layer.

According to the present invention, while manufacturing the solar cell, the photoresist is formed at specific areas of the electrodes so as to reduce the consumption of photoresist and manufacturing costs, and lessen environmental pollution. Moreover, because the electrodes are formed in openings of the dielectric layers, the shape of the electrodes is limited by the openings. As a result, a linewidth of the electrodes of the solar cell will be precisely controlled. Ultimately, the electrodes will not be expanded and the linewidth of the electrodes will not be increased so that light-trapping surfaces of the solar cell would not be decreased.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
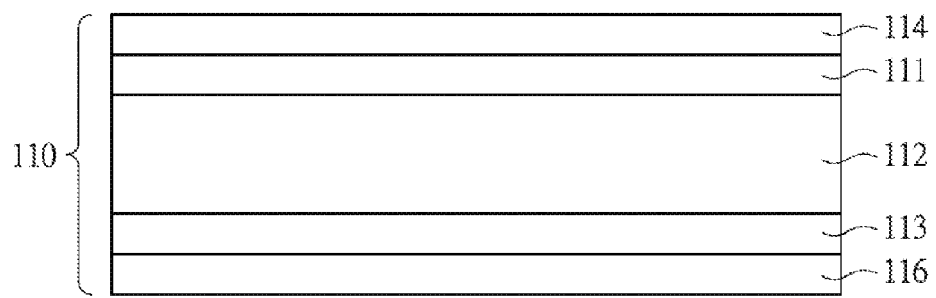
FIGS. 1A-1F are schematic diagrams illustrating a fabricating method for a solar cell in accordance with one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIGS. 1A-1F are schematic diagrams of a fabricating method for a solar cell in accordance with one embodiment of the present invention.

Referring to FIG. 1A, a substrate 110 is provided. The substrate 110 includes an N-type single crystal silicon layer 112, a first heterogeneous interlayer 111 and second heterogeneous interlayer 113 respectively formed on opposite surfaces of the N-type single crystal silicon layer 112, a P-type amorphous silicon (a-Si) layer 114 formed on a surface of the first heterogeneous interlayer 111, and an N-type amorphous silicon (a-Si) layer 116 formed on a surface of the second heterogeneous interlayer 113. The first heterogeneous interlayer 111 and the second heterogeneous interlayer 113 may be intrinsic a-Si layers.

Figure 1B:
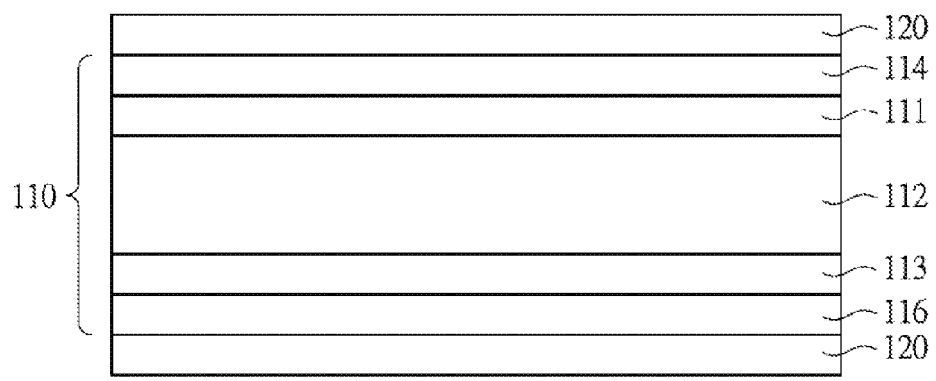
Figure 1C:
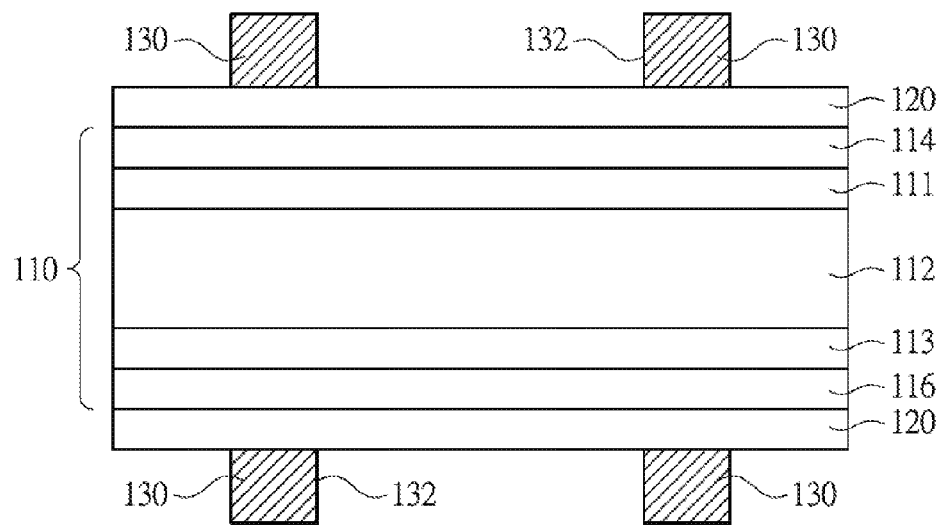

Referring to FIG. 1B, transparent conductive layers 120 are formed on the substrate 110. In this embodiment, the transparent conductive layers 120 are formed on two opposite surfaces of the substrate 110, respectively. That is, the transparent conductive layers 120 are formed on the P-type a-Si layer 114 and the N-type a-Si layer 116, respectively. The transparent conductive layers 120 may be made of transparent conductive oxide (Transparent Conductive Oxide (TCO)), such as Indium Tin Oxide (ITO), Zinc Oxide, Al-doped ZnO, Gallium Zinc Oxide, or Indium Zinc Oxide. In the description to follow, a configuration on one of the two transparent conductive layers 120 is described, and it should be assumed that an identical configuration is formed on the other transparent conductive layers 120.

Referring to FIG. 1O, a plurality of photoresist patterns 130 are formed on the transparent conductive layer 120. The steps of fabricating the photoresist patterns 130 may include forming a photoresist layer (not shown) on the transparent conductive layer 120, and performing a lithography process using a suitable photomask pattern so that the photoresist patterns 130 are formed on predetermined electrode areas. The photoresist pattern 130 has a cross section in rectangular, and sidewalls 132 of each of the rectangular sections of the photoresist pattern 130 are substantially perpendicular to the transparent conductive layer 120.

Figure 1D:
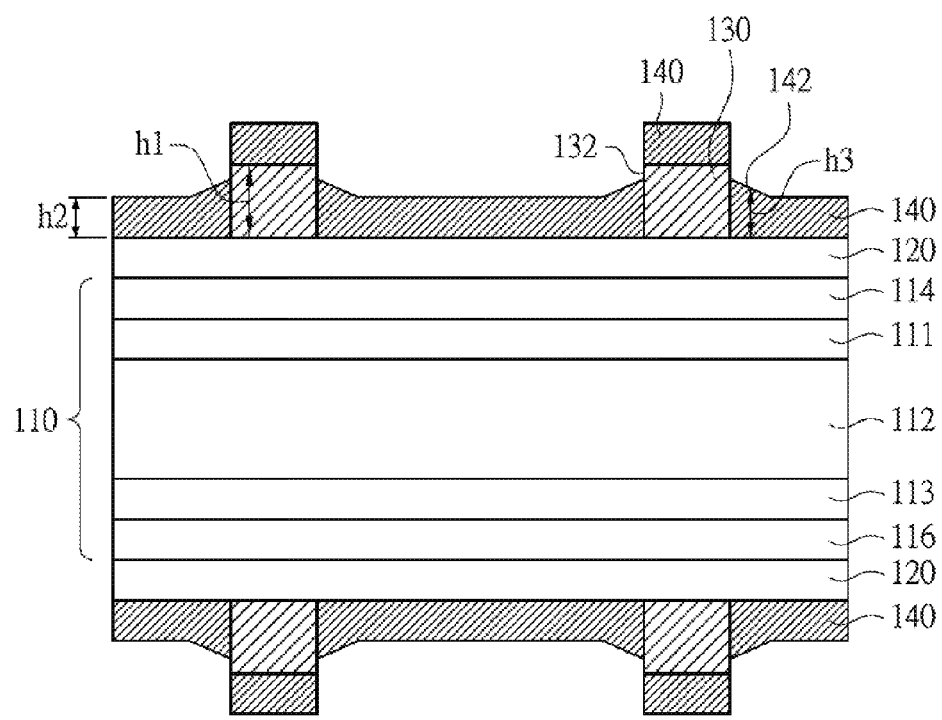

Referring to FIG. 1D, a dielectric layer 140 is formed to cover the photoresist patterns 130 and transparent conductive layer 120. Because a thickness of the photoresist patterns 130 is substantially larger than a thickness of the dielectric layer 140, a height h1 of the photoresist patterns 130 is slightly more than a height h2 of the dielectric layer 140, as shown in the cross-sectional view. Thus, because the dielectric layer 140 is formed on the photoresist pattern 130, which has the height h1, a part of sidewalls 132 the photoresist pattern 130 is exposed from the dielectric layer 140 and a profile of the dielectric layer 140 is discontinuous. Specifically, protrusions 142 of the dielectric layer 140 are defined at areas surrounding the photoresist patterns 130, in which the height of the protrusions 142 is gradually and outwardly decreased from the photoresist pattern 130 to the surrounding dielectric layer part. The height h1 of the photoresist patterns 130 is more than a height h3 of the protrusions 142 so that a part of sidewalls 132 of the photoresist patterns 130 is exposed from the dielectric layer 140.

The height h1 of the photoresist pattern 130 is measured from the upper surface of the photoresist pattern 130 to the upper surface of transparent conductive layer 120. The height h2 of the dielectric layer 140 is measured from the upper surface to the lower surface of the dielectric layer 140, or from the upper surface of the dielectric layer 140 to the upper surface of transparent conductive layer 120. It does not include the part which the dielectric layer 140 is on the top of the photoresist pattern 130 or the protrusion 142. The height h3 of the protrusions 142 is measured from the upper surface of the protrusions 142 to the upper surface of the transparent conductive layer 120.

Figure 1E:
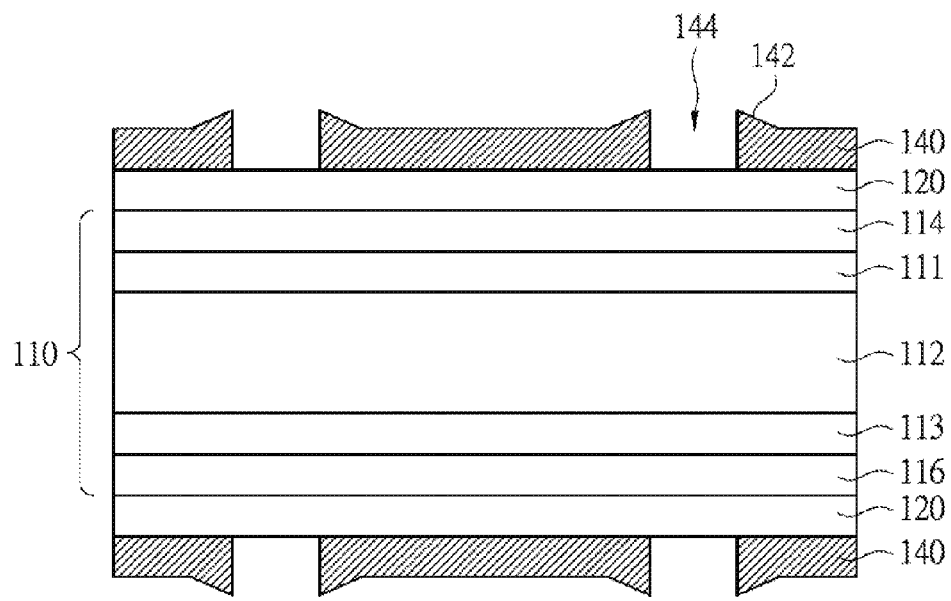

Referring to FIG. 1E, when the photoresist pattern 130 is removed (see FIG. 1D), the portions of the dielectric layer 140 which is over the photoresist pattern 130 are also removed. After the photoresist pattern 130 and portions of the dielectric layer 140 over the photoresist pattern 130 are removed, the openings 144 are formed in the remaining part of the dielectric layer 140 corresponding to the shape of the photoresist pattern 130. Specifically, after the photoresist pattern 130 is removed, a plurality of openings 144 and a plurality of protrusion 142 surrounding the openings 144 are formed in the dielectric layer 140. The openings 144 are defined by the protrusions 142, and cross sections of the protrusions 142 are similar to volcanic craters.

Figure 1F:
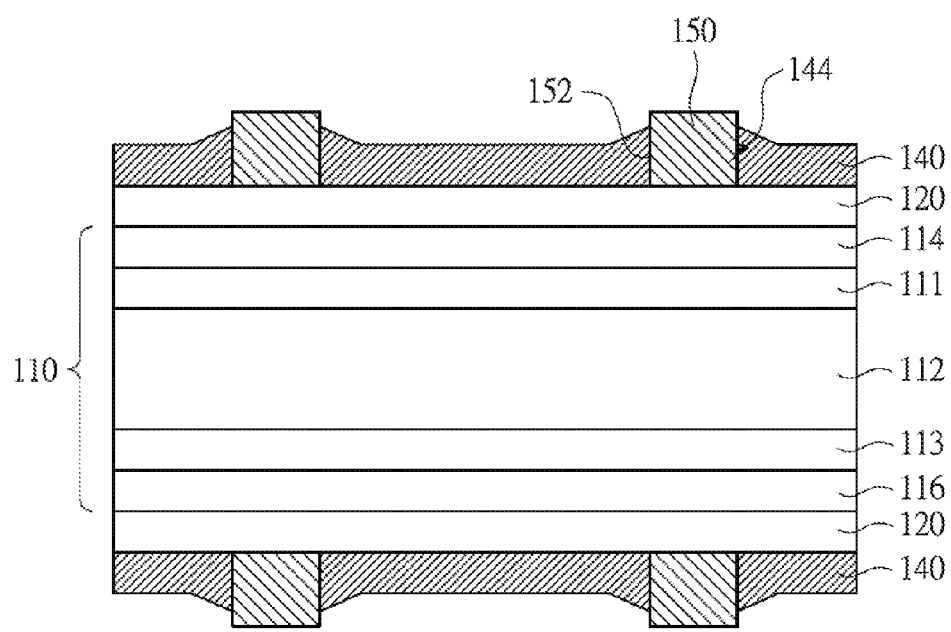

FIG. 1F illustrates a plurality of electrodes 150 formed in the openings 144. The electrodes 150 are formed by an electroplating process. Since the formation of the electrodes 150 is limited by the dielectric layer 140, the electrodes 150 will be formed in the predetermined openings 144, and the electroplating area will not extend over the openings 144. Specifically, the electrodes 150 are formed in the openings 144, and the shape of the electrodes 150 is substantially equivalent to or similar to the shape of the photoresist pattern 130 (see FIG. 1C). Cross sections of the electrodes 150 are substantially rectangular, and the sidewalls 152 of the electrodes 150 are substantially perpendicular to the transparent conductive layer 120.

Compared with electrodes made of silver paste in the prior art, the present invention utilizes a method for fabricating the electrodes 150 at predetermined positions. The electrodes 150 are made of metal, and in some embodiments, may be made of copper. For instance, the height of silver paste electrodes in the prior art is about 30 µm, and the resistivity of the silver paste electrodes is about 12 µohm-cm. However, according to the present invention, the height of the copper electrodes is about 5 µm, and the resistivity of the copper electrodes is about 2 µohm-cm. If the electrodes 150 are made of copper, the electrode thickness is significantly decreased and the resistivity is also significantly lowered. Moreover, the manufacturing cost of copper electrodes is lower than that of silver paste electrodes.

According to another embodiment, the dielectric layer 140 may be removed.

According to one embodiment, the photoresist pattern 130 may be formed only at a predetermined electrode area of the substrate 110 by a screen printing process so as to reduce the consumption of photoresist, lower manufacturing costs, and lessen environmental pollution. This is in contrast to the prior art, in which a sophisticated pattern is not easily formed by a screen printing process if the pattern is made of silver paste. According to the present invention, the electrodes 150 are formed by an electroplating process so that the electrodes 150 will be restricted in the openings 144 of the dielectric layer 140, and the electroplating material will not overflow out of the openings 144. Hence, the linewidth of the electrodes 150 of the solar cell can be precisely controlled.

Figure 2:
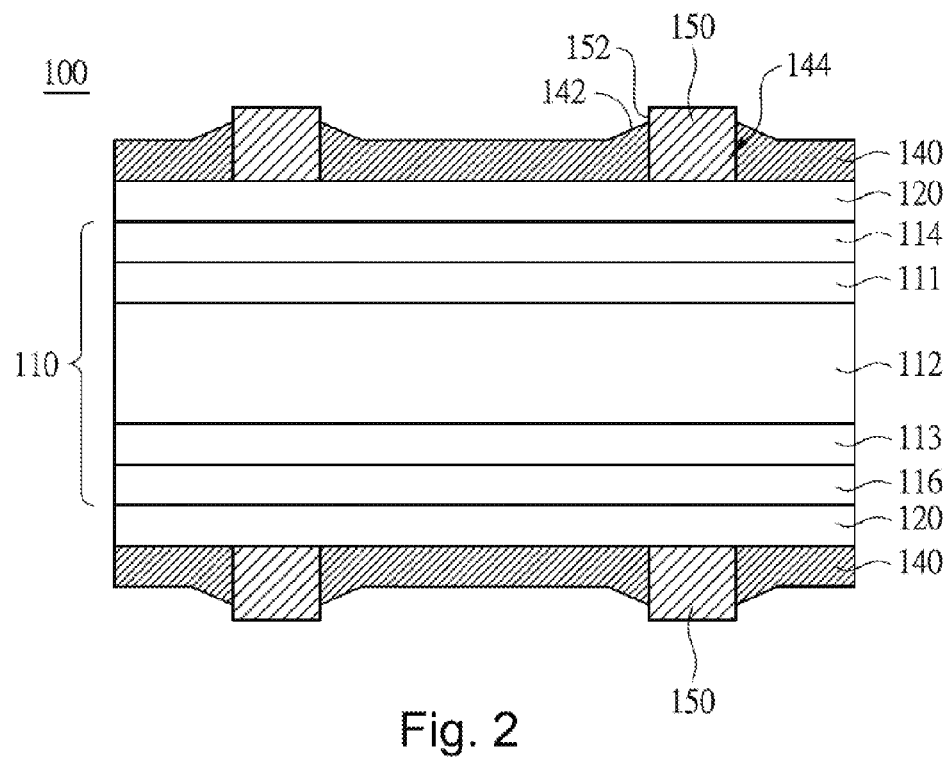
FIG. 2 is a cross-sectional view of the solar cell made by the fabricating method of FIGS. 1A-1F according to the present invention.

FIG. 2 illustrates a cross-sectional view of the solar cell that is fabricated by a method as shown in FIGS. 1A-1F. The solar cell 100 includes the substrate 110, the transparent conductive layers 120 formed at opposite surfaces of the substrate 110, the dielectric layers 140 formed on the transparent conductive layers 120, and the electrodes 150 formed in the openings 144 of the dielectric layer 140.

The substrate 110 includes the N-type single crystal silicon layer 112, the first heterogeneous interlayer 111 and the second heterogeneous interlayer 113 formed on two opposite surfaces of the N-type single crystal silicon layer 112, the P-type a-Si layer 114 formed on the surface of the first heterogeneous interlayer 111, and the N-type a-Si layer 116 formed on the surface of the second heterogeneous interlayer 113. The first heterogeneous interlayer 111 and the second heterogeneous interlayer 113 may be intrinsic a-Si layers. The transparent conductive layers 120 may be formed on the P-type a-Si layer 114 and the N-type a-Si layer 116 of the substrate 110.

The dielectric layers 140 include the openings 144 and the protrusions 142 surrounding the openings 144. The electrodes 150 are formed in the openings 144 respectively. The shapes of the electrodes 150 are substantially the same as those of the openings 144. The cross sections of the protrusions 142 is similar to volcanic craters, and the height of the protrusions 142 is gradually and outwardly decreased from the electrodes 150 to the surrounding dielectric layers 142. Moreover, the protrusions 142 have an inclined surface around the electrodes 150.

Because the electrodes 150 are formed in the openings 144 of the dielectric layers 140, the electrode shapes and growth areas thereof are limited by the openings 144 and a linewidth of the electrodes 150 will be precisely controlled. Thus, the electrodes 150 will not be expanded and a linewidth of the electrodes will not be increased so that the light-trapping surfaces of the solar cell 100 will not be decreased. Specifically, the shapes of the electrodes 150 are substantially the same as those of the openings 144, and cross sections of the electrodes 150 are rectangular. Moreover, the sidewalls 152 of the electrodes 150 are substantially perpendicular to the transparent conductive layer 120.

If the dielectric layers 140 are made of a suitable material, then the dielectric layers 140 may serve as an anti-reflective layer and the cost associated with performing an additional process step may be avoided. For instance, the dielectric layers 140 may be made of aluminum oxide, magnesium oxide, silicon oxide, tantalum oxide, zinc oxide, or silicon oxynitride.

FIGS. 3A-3F illustrate steps for fabricating a solar cell according to another embodiment of the present invention. For the beginning steps of this embodiment, reference may be made to FIGS. 1A-1B, in which the substrate 110 is shown including the N-type single crystal silicon layer 112, the first heterogeneous interlayer 111 and the second heterogeneous interlayer 113 formed on two opposite surfaces of the N-type single crystal silicon layer 112, the P-type a-Si layer 114 formed at the surface of the first heterogeneous interlayer 111, and the N-type a-Si layer 116 formed at the surface of the second heterogeneous interlayer 113. Moreover, the transparent conductive layers 120 may be formed on the substrate 110.

As in the case of the embodiment described above, in the description to follow, a configuration on one of the two transparent conductive layers 120 is described, and it should be assumed that an identical configuration is formed on the other transparent conductive layers 120.

Figure 3A:
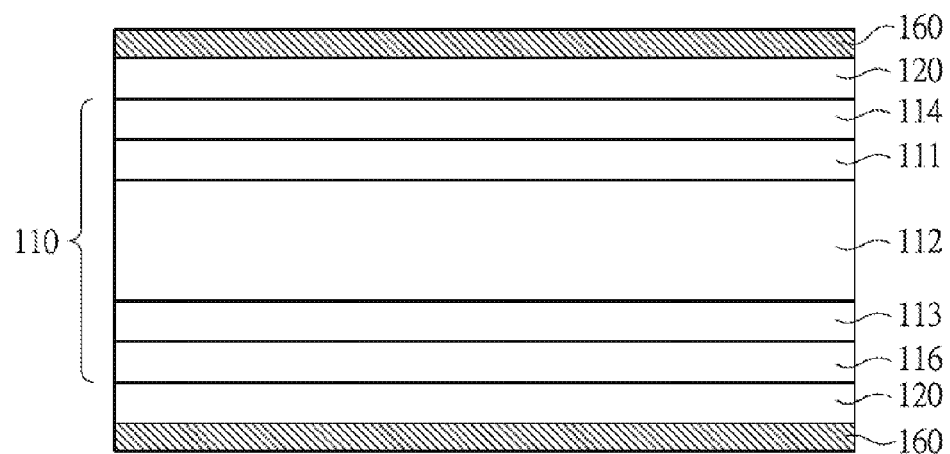
FIGS. 3A-3F are schematic diagrams illustrating a fabricating method for a solar cell in accordance with another embodiment of the present invention.

As shown in FIG. 3A, a seed conductive layer 160 is formed on the transparent conductive layer 120 and covers the transparent conductive layer 120. The seed conductive layer 160 may be made of metal such as copper. The seed conductive layer 160 may enhance conductivity so as to facilitate a subsequent electroplating process. The thickness of the seed conductive layer 160 is about 0.1 µm.

Figure 3B:
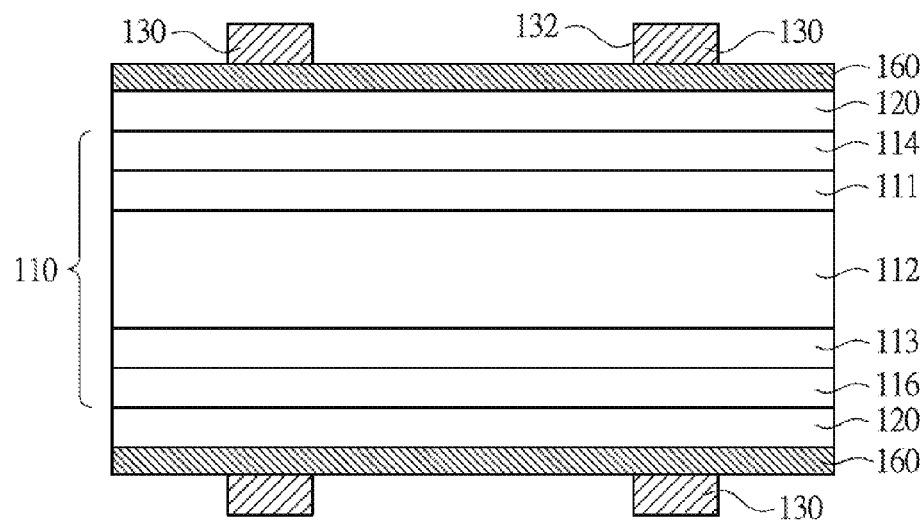

As shown in FIG. 3B, a plurality of photoresist pattern 130 are formed on the seed conductive layer 160. While forming the photoresist patterns 130, for instance, a photoresist layer (not shown) may be formed on the transparent conductive layer 120 and a lithography process may be performed using a suitable photomask pattern so that the photoresist patterns 130 are formed on electrode positions, or the photoresist patterns 130 are formed by a screen printing process. The photoresist patterns 130 have a cross section that includes a plurality of rectangular sections, and sidewalls 132 of each of the rectangular sections of the photoresist pattern 130 are substantially perpendicular to the transparent conductive layer 120.

Figure 3C:
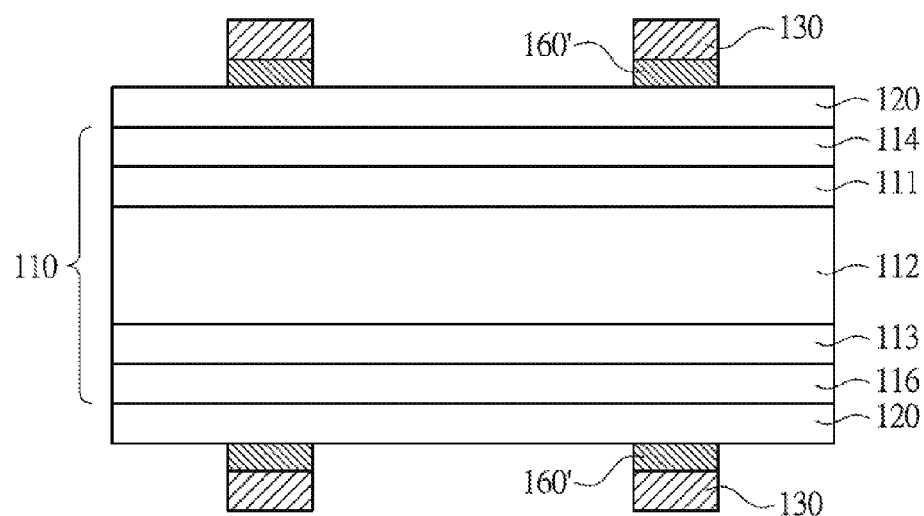

As shown in FIG. 3C, the photoresist patterns 130 are used as a photomask, and the seed conductive layer 160 is subjected to an etching process. Part of the seed conductive layer 160 covered by the photoresist pattern 130 will remain intact, while the parts of the seed conductive layer 160 not covered by the photoresist pattern 130 will be etched and removed so that a seed conductive pattern layer 160' is formed.

Figure 3D:
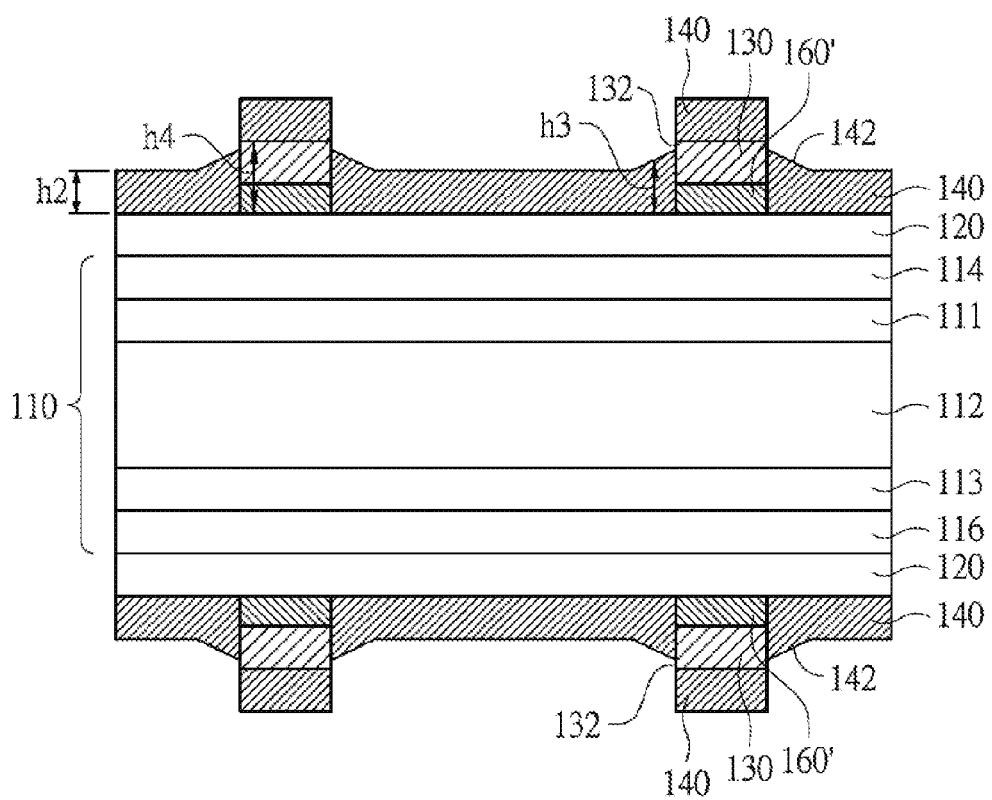

As shown in FIG. 3D, a dielectric layer 140 is disposed to cover the photoresist pattern 130 and the transparent conductive layer 120. A total thickness h4 of the photoresist pattern 130 and the seed conductive pattern layer 160' is substantially more than a height h2 of the dielectric layer 140. Thus, because the discontinuous structure is formed between a stack consisting of the photoresist pattern 130 and the seed conductive pattern layer 160', and the surrounding dielectric layer 140, a part of sidewalls 132 of the photoresist pattern 130 is not covered by the dielectric layer 140 due to the stack consisting of the photoresist pattern 130 and the seed conductive pattern layer 160', is higher than the surrounding dielectric layer 140. Specifically, the height of the protrusions 142 is gradually and outwardly decreased from the photoresist pattern 130 to the surrounding dielectric layer 140. The total height of the photoresist pattern 130 and the seed conductive pattern layer 160' is more than a height h3 of the protrusion 142 so that a part of the sidewalls 132 of the photoresist pattern 130 is not covered by the dielectric layer 140.

As mentioned above, the height h2 of the dielectric layer 140 is defined as a distance between the upper surface of the dielectric layer 140 and the lower surface of the dielectric layer 140, or from the upper surface of the dielectric layer 140 to the upper surface of the transparent conductive layer 120. However, this definition of the height h2 does not include the part of the dielectric layer 140 on the top of the photoresist pattern 130 or the protrusion 142. The height h3 of the protrusion 142 is measured from the upper surface of the protrusion 142 to the upper surface of the transparent conductive layer 120. The total thickness h4 of the photoresist pattern 130 and the seed conductive pattern layer 160' is a distance measured from the upper surface of the photoresist pattern 130 over the seed conductive pattern layer 160' to the upper surface of the transparent conductive layer 120.

Figure 3E:
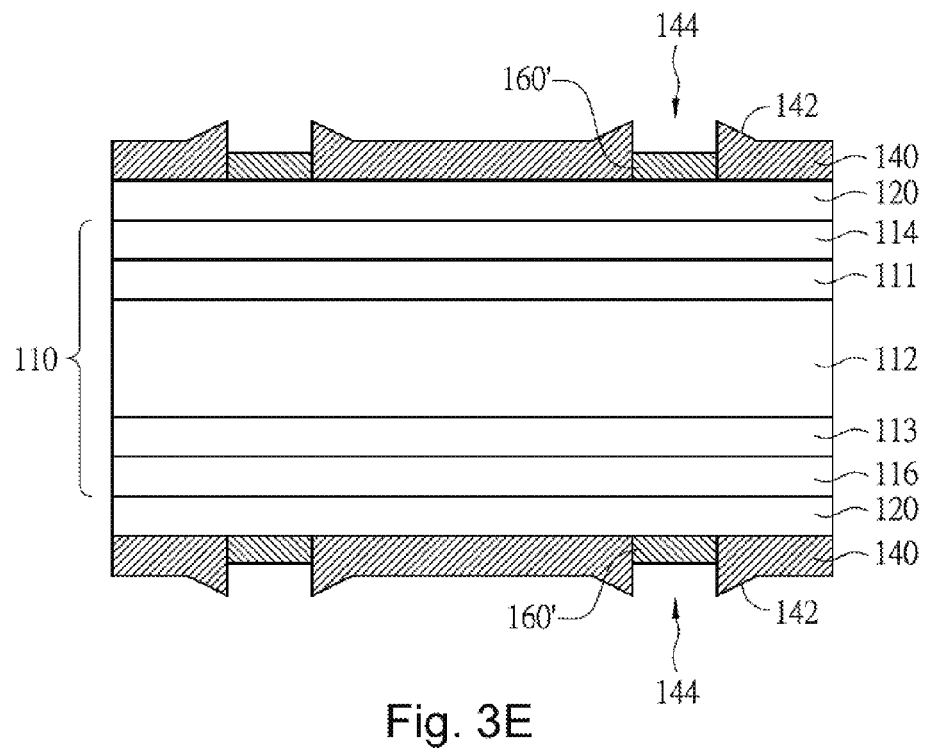

Referring to FIG. 3E, when the photoresist patterns 130 are removed (see FIG. 3D), portions of the dielectric layer 140 over the photoresist pattern 130 are also removed in the step of removing the photoresist patterns 130. However, the seed conductive pattern layer 160' that is covered by the photoresist pattern 130 will remain intact. After the photoresist patterns 130 and portions of the dielectric layer 140 over the photoresist pattern 130 are removed, openings 144 are formed in the remaining part of the dielectric layer 140 corresponding to the shape of the photoresist pattern 130. The seed conductive pattern layer 160' exists in the openings 144. Specifically, after the photoresist pattern 130 is removed, a plurality of openings 144 and a plurality of protrusions 142 surrounding the openings 144 are formed in the dielectric layer 140. The openings 144 are defined by the protrusions 142, and cross sections of the protrusions 142 is similar to volcanic craters.

Figure 3F:
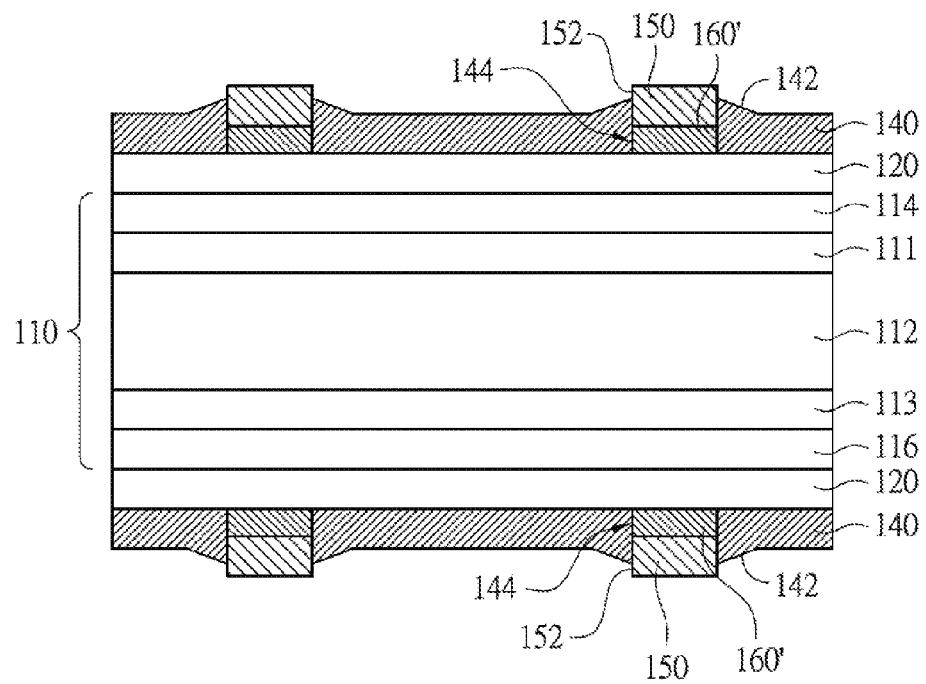

FIG. 3F illustrates a plurality of electrodes 150 formed in the openings 144. The electrodes 150 are formed on the seed conductive pattern layer 160' by an electroplating process. Because the seed conductive pattern layer 160' has a better conductivity, it facilitates the subsequent electroplating process for the electrodes 150. When the electrodes 150 are formed by the electroplating process, the manner in which the electrodes 150 grow is limited by the dielectric layer 140, and the electrodes 150 will be formed in the predetermined opening 144. Thus, the electroplating area will not extend over the opening 144. Specifically, the electrodes 150 are formed in the openings 144, and the shape of the electrodes 150 is substantially equivalent to or similar to the shape of the photoresist pattern 130 (see FIG. 3F). Cross sections of the electrodes 150 are substantially rectangular, and the sidewalls 152 of the electrodes 150 are substantially perpendicular to the transparent conductive layer 120. The electrodes 150 are used as electrodes of solar cells.

According to another embodiment, the dielectric layer 140 may be removed.

Figure 4:
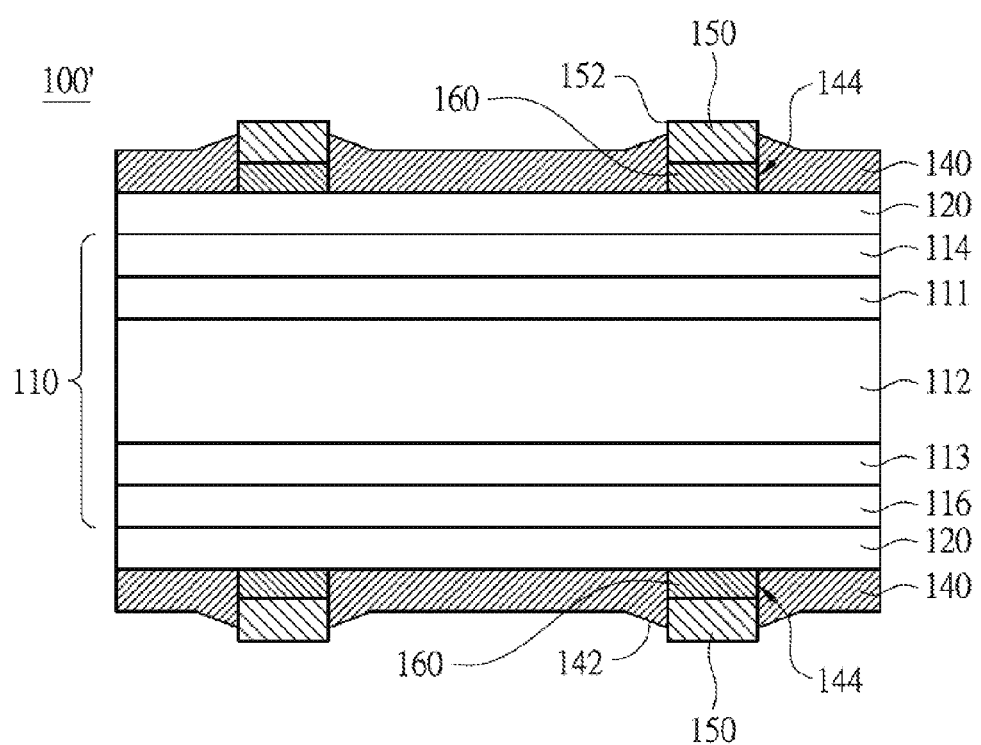
FIG. 4 is a cross-sectional view of the solar cell made by the fabricating method of FIGS. 3A-3F according to the present invention

FIG. 4, it illustrates a cross-sectional view of the solar cell that is fabricated by a method as shown in FIGS. 3A-3F. The solar cell 100' includes the substrate 110, the transparent conductive layers 120 formed on opposite surfaces of the substrate 110, the dielectric layers 140 formed on the transparent conductive layer 120, and the electrodes 150 formed in the openings 144 of the dielectric layer 140.

The substrate 110 includes the N-type single crystal silicon layer 112, the first heterogeneous interlayer 111 and second heterogeneous interlayer 113 formed on two opposite surfaces of the N-type single crystal silicon layer 112, the P-type a-Si layer 114 formed at the surface of the first heterogeneous interlayer 111, and the N-type a-Si layer 116 formed at the surface of the second heterogeneous interlayer 113. The first heterogeneous interlayer 111 and the second heterogeneous interlayer 113 may be intrinsic a-Si layers. The transparent conductive layers 120 may be formed on the P-type a-Si layer 114 and the N-type a-Si layer 116 of the substrate 110.

The dielectric layers 140 include the openings 144 and the protrusion 142 surrounding the openings 144. The seed conductive pattern layer 160' are formed in the openings 144, and the electrodes 150 are formed in the openings 144 respectively and over the seed conductive pattern layer 160'. The shapes of the electrodes 150 are substantially the same as those of the openings 144. The cross sections of the protrusions 142 is similar to volcanic craters, and the height of the protrusions 142 is gradually and outwardly decreased from the electrodes 150 to the surrounding dielectric layers 140. Moreover, the protrusions 142 have an inclined surface around the electrodes 150.

The electrodes 150 are formed in the openings 144 of the dielectric layers 140. The electrodes 150 are made of metal, and in some embodiments, are made of copper. The heights of copper electrodes are about 5 µm, and resistivity of the copper electrodes is about 2 µohm-cm. Because the electrodes 150 are formed in the openings 144 of the dielectric layers 140, the electrode shapes and growth areas thereof are limited by the openings 144 and a linewidth of the electrodes 150 will be precisely controlled. Thus, the electrodes 150 will not be expanded and a linewidth of the electrodes will not be increased so that the light-trapping surfaces of the solar cell 100 will not be decreased. Specifically, the shapes of the electrodes 150 are substantially the same as those of the openings 144, and cross sections of the electrodes 150 are rectangular. Moreover, the sidewalls 152 of the electrodes 150 are substantially perpendicular to the transparent conductive layer 120.

If the dielectric layers 140 are made of a suitable material, then the dielectric layers 140 may serve as an anti-reflective layer of the solar cell 100' and the cost associated with performing an additional process step may be avoided.

Although the foregoing embodiments illustrate the transparent conductive layers 120 and the electrodes 150 formed on two opposite surfaces of the substrate 110, in practice, they may be modified to meet different requirements so that the transparent conductive layer 120 and the electrodes 150 are only formed on one surface of the substrate 110. That is, the transparent conductive layer 120 is formed on the P-type a-Si layer 114 or the N-type a-Si layer 116 of the substrate 110. Subsequently, the electrodes 150 are formed on the transparent conductive layer 120.

The seed conductive layers 160 may be optionally formed between the photoresist patterns 130 and the transparent conductive layers 120 so as to enhance conductivity so as to facilitate a subsequent electroplating process. The seed conductive layers 160 may be made of copper, and the thickness of the seed conductive layers 160 is about 0.1 µm. Alternatively, the transparent conductive layer 120 having a good conductivity is selected or the conductivity of the electrode area of the transparent conductive layer 120 may be enhanced, and the seed conductive layer 160 may be omitted from the configuration of the solar cell.

After the electrodes 150 are formed, the dielectric layers 140 may be removed. Alternatively, the dielectric layers 140 may be made of a suitable material and used as anti-reflective layers.

As shown in the foregoing embodiments, when fabricating the solar cells, the photoresist is only disposed on predetermined areas of electrodes so as to decrease photoresist consumption, reduce manufacturing costs, and lessen the negative impact on the environment. Moreover, the electrodes are formed at openings of the dielectric layers so the shape of the electrodes will be limited by the openings. Thus, the linewidth of the electrodes of the solar cell will be precisely controlled. The electrodes will not extend over the openings and light-trapping surfaces of the solar cell will not be decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A fabricating method for a solar cell, comprising:
   providing a substrate;
   forming a transparent conductive layer on a surface of the substrate;
   forming a plurality of photoresist patterns on the transparent conductive layer;
   forming a dielectric layer on the photoresist patterns and the transparent conductive layer, in which a part of a sidewall of the photoresist pattern is exposed from the dielectric layer;
   removing the photoresist patterns and a part of the dielectric layer covering the photoresist pattern so that a plurality of openings are defined in the remaining part of the dielectric layer; and
   forming a plurality of electrodes in the openings respectively.

2. The fabricating method of claim 1, further comprising:
   conformally forming a seed conductive layer on the transparent conductive layer before the photoresist patterns are formed, wherein the electrodes are formed on the seed conductive layer.

3. The fabricating method of claim 1, wherein sidewalls of the electrodes are substantially perpendicular to the transparent conductive layer.

4. The fabricating method of claim 1, further comprising:
removing the dielectric layer after the electrodes are formed.

5. The fabricating method of claim 1, wherein forming the electrodes in the openings comprises using an electroplating process.

6. The fabricating method of claim 1, wherein the substrate comprises:
an N-type single crystal silicon layer;
a first heterogeneous interlayer and a second heterogeneous interlayer formed on two opposite surfaces of the N-type single crystal silicon layer;
a P-type amorphous silicon layer formed on the first heterogeneous interlayer; and
an N-type amorphous silicon layer formed on the second heterogeneous interlayer, wherein the transparent conductive layer is formed on the P-type amorphous silicon layer or the N-type amorphous silicon layer.

* * * * *